(12) United States Patent
Geerligs et al.

(10) Patent No.: US 11,152,527 B2
(45) Date of Patent: Oct. 19, 2021

(54) HYBRID TANDEM SOLAR CELL

(71) Applicant: Stichting Energieonderzoek Centrum Nederland, Petten (NL)

(72) Inventors: Lambert Johan Geerligs, Petten (NL); Yu Wu, Petten (NL); Dong Zhang, Petten (NL); Johannes Adrianus Maria van Roosmalen, Petten (NL); Stefan Libertus Luxembourg, Petten (NL); Siegfried Christiaan Veenstra, Petten (NL)

(73) Assignee: Nederlandse Organisatie voor toegepast-natuurwetenschappelijk Onderzoek TNO, 's-Gravenhage (NL)

( * ) Notice: Subject to any disclaimer, the term of this patent is extended or adjusted under 35 U.S.C. 154(b) by 96 days.

(21) Appl. No.: 16/063,335

(22) PCT Filed: Dec. 19, 2016

(86) PCT No.: PCT/NL2016/050892
§ 371 (c)(1),
(2) Date: Jun. 18, 2018

(87) PCT Pub. No.: WO2017/105248
PCT Pub. Date: Jun. 22, 2017

(65) Prior Publication Data
US 2018/0374977 A1 Dec. 27, 2018

(30) Foreign Application Priority Data

Dec. 18, 2015 (NL) .................................... 2015987
Aug. 26, 2016 (NL) .................................... 2017380

(51) Int. Cl.
*H01L 31/0725* (2012.01)
*H01L 31/078* (2012.01)
(Continued)

(52) U.S. Cl.
CPC ........ *H01L 31/0725* (2013.01); *H01L 27/302* (2013.01); *H01L 31/02245* (2013.01);
(Continued)

(58) Field of Classification Search
None
See application file for complete search history.

(56) References Cited

U.S. PATENT DOCUMENTS

2016/0126401 A1  5/2016  Iannelli et al.
2016/0181456 A1  6/2016  Zhang

FOREIGN PATENT DOCUMENTS

CN       105810772 A    7/2016
WO       2015/017885 A1 2/2015
(Continued)

*Primary Examiner* — Shannon M Gardner
(74) *Attorney, Agent, or Firm* — N.V. Nederlandsch Octrooibureau; Catherine A. Shultz; Katelyn J. Bernier

(57) ABSTRACT

A tandem solar cell includes a top solar cell and a bottom solar cell. The top solar cell and the bottom solar cell each have a respective front surface and a rear surface, with the respective front surfaces being adapted for facing a radiation source during use. The top solar cell is arranged with its rear surface overlying the front surface of the bottom solar cell. The top solar cell includes a photovoltaic absorber layer with a bandgap greater than that of crystalline silicon. The bottom solar cell includes a crystalline silicon substrate. On at least a portion of the front surface of the bottom solar cell a passivating layer stack is disposed which includes a thin dielectric film and a secondary layer of either selective carrier extracting material or polysilicon. The thin dielectric film is arranged between the silicon substrate and the secondary layer.

23 Claims, 3 Drawing Sheets

(51) Int. Cl.
*H01L 51/42* (2006.01)
*H01L 51/44* (2006.01)
*H01L 31/0224* (2006.01)
*H01L 27/30* (2006.01)
*H01L 31/0236* (2006.01)
*H01L 31/18* (2006.01)
*H01L 31/043* (2014.01)

(52) U.S. Cl.
CPC .................. *H01L 31/02366* (2013.01); *H01L 31/022425* (2013.01); *H01L 31/022441* (2013.01); *H01L 31/022466* (2013.01); *H01L 31/043* (2014.12); *H01L 31/078* (2013.01); *H01L 31/1868* (2013.01); *H01L 31/1884* (2013.01); *H01L 51/4213* (2013.01); *H01L 51/445* (2013.01); *Y02E 10/549* (2013.01); *Y02P 70/50* (2015.11)

(56) References Cited

FOREIGN PATENT DOCUMENTS

| | | |
|---|---|---|
| WO | 2015/084961 A1 | 6/2015 |
| WO | 2016/090179 A1 | 6/2016 |

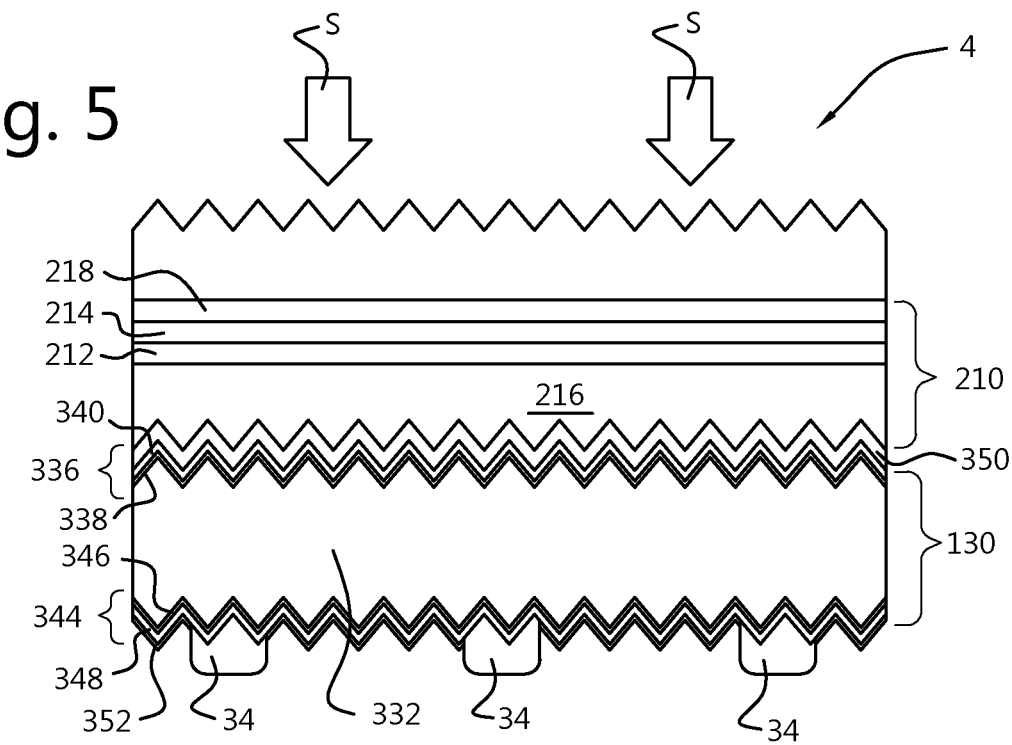
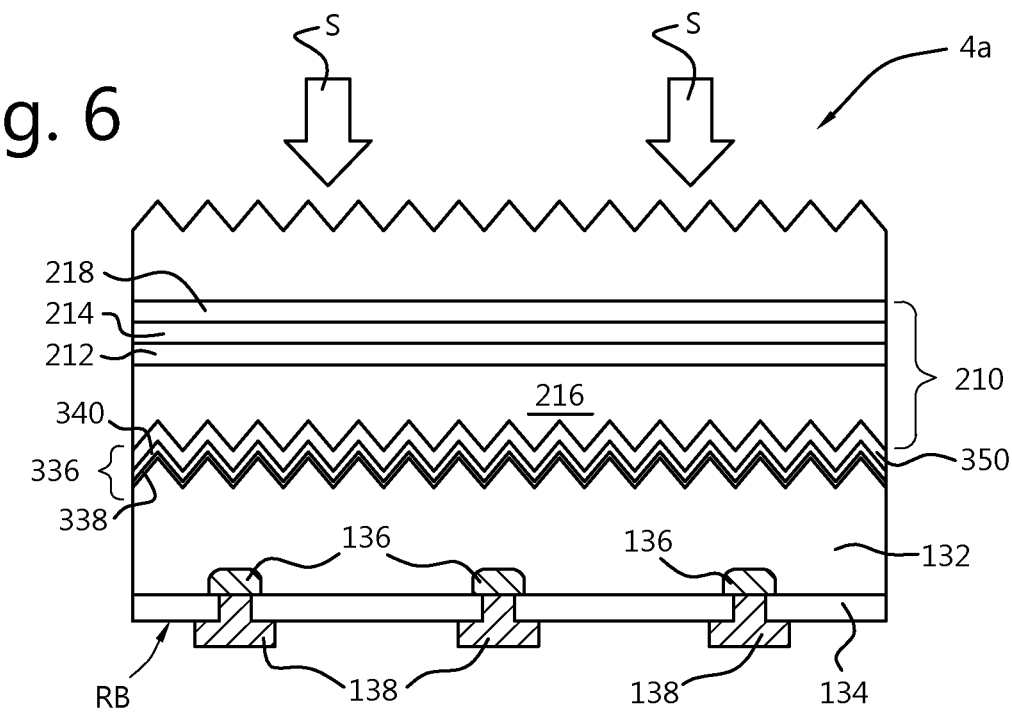

HYBRID TANDEM SOLAR CELL

FIELD OF THE INVENTION

The present invention relates to a tandem solar cell. Moreover, the invention relates to a method for manufacturing such a tandem solar cell. Also, the invention relates to a solar panel comprising at least one such tandem solar cell.

BACKGROUND ART

Tandem solar cells are known consisting of a crystalline silicon bottom cell with amorphous silicon (a-Si) heterojunctions, and a higher bandgap top solar cell. While the bottom solar cell thanks to the a-Si heterojunctions provides high Voc, which is beneficial for tandem performance, this bottom solar cell design has several disadvantages. These disadvantages are e.g.: i) the low lateral conductance of the amorphous silicon heterojunction, which necessitates the use of transparent conductive oxide (TCO) electrodes, which (unless costly materials such as hydrogen or tungsten doped InOx, indium oxide, are used) have large IR absorption; ii) the low thermal robustness of amorphous silicon passivation which means that the resulting cells cannot be regularly soldered for interconnection, and processing of the top cell in case of a 2-terminal tandem structure is also thermally limited; iii) the complex process and high cost necessary for producing an interdigitated back contact version of a cell with amorphous silicon heterojunctions.

It is an object of the present invention to overcome or mitigate the disadvantages of the prior art.

SUMMARY OF THE INVENTION

The object is achieved by a tandem solar cell comprising a top solar cell and a bottom solar cell; the top solar cell and the bottom solar cell each having a respective front surface and a rear surface; the respective front surfaces being adapted for facing a radiation source during use; the top solar cell being arranged with its rear surface adjacent to (i.e., stacked on, or overlying) the front surface of the bottom solar cell;
  the top solar cell comprising a photovoltaic absorber layer with a bandgap greater than that of crystalline silicon;
  the bottom solar cell comprising a crystalline silicon substrate;
  where on at least a portion of the area of the front surface of the crystalline silicon substrate a passivating layer stack is disposed which comprises a thin dielectric such as a thin oxide ("tunnel oxide") film and a secondary layer of either selective carrier extracting material or polysilicon, the thin dielectric film being arranged between the silicon substrate and the secondary layer.

Advantageously, since the materials in the passivating layer stack can be chosen to be thermally stable structures compared to the amorphous heterojunction layers of the prior art, the invention provides an improved thermal robustness of the bottom solar cell, and a relatively lower production cost than for an amorphous silicon heterojunction cell as bottom solar cell in a tandem solar cell. Such high thermal robustness can allow to use manufacturing processes with relatively high temperature such as standard fire-through metallization, etc.

Also, to use a passivating layer stack with a combination of a thin passivating dielectric such as a tunnel oxide and a secondary layer can provide a comparatively low recombination rate of charge carriers which results in higher $V_{oc}$ and FF values, and higher performance of the tandem solar cell. This is particularly the case when the secondary layer provides for selective carrier extraction (also described as selective carrier collection) from the silicon substrate, in which case the passivating layer stack is known as a passivated contact or passivating contact. Enhancement of the tandem solar cell is also particularly the case when the secondary layer is an intrinsic (not intentionally doped, at most lightly doped) polysilicon layer, which does not result in a passivating contact but provides excellent passivation.

Moreover, the prior art application of a TCO electrode to compensate for low lateral conductance in the amorphous heterojunction can be omitted, as the selective carrier extracting material of the secondary layer, such as highly doped polysilicon of a thickness of at least several tens of nm's, can provide lateral conductance.

In present scientific understanding, it is argued that a good carrier selectivity requires a good interface passivation (interface between the substrate and the carrier collecting layer stack), e.g. by a thin silicon oxide. In this sense the thin dielectric can be viewed as being part of the selective carrier collecting structure, and the secondary layer by itself is not necessarily very carrier selective in the absence of the thin dielectric. However, a thin silicon oxide itself does not create the selectivity for electrons or holes. That selectivity must be created by the materials disposed on the thin silicon oxide. Therefore herein when referring to selective carrier extracting or collecting materials, it is meant the materials or layers that are disposed on the thin silicon oxide or thin dielectric film in order to induce selective carrier collecting properties. Also in present scientific understanding, the thin dielectric performs at least three functions: i) passivating the interface with the silicon substrate to reduce carrier recombination, ii) reducing the transmission of minority charge carriers from the silicon substrate to the selective carrier extracting material (where minority is defined as the polarity or type opposite to the polarity or type of the selective carrier extracting material), and iii) transmission of majority charge carriers sufficient for not more than small resistive losses of the bottom solar cell.

Thin dielectrics that yield good performance are e.g., silicon oxide (e.g. silicon dioxide) and silicon oxynitrides. Other possible thin dielectrics are for example aluminium oxide or hafnium oxide. A typical silicon oxide or oxynitride thickness is between ~0.5 and ~5 nm, preferably ~1–~2 nm. An thin oxide thicker than about 1.5 nm can fulfill the required function of good passivation and a sufficient transmission of majority charge carriers, and a sufficiently low transmission of minority charge carriers, depending on process conditions such as thermal anneal processes that create e.g. pinholes in the thin oxide film.

A wide bandgap top cell typically consists of an absorber layer (for example: metal-organic halide perovskite, kesterite such as copper zinc tin sulfide, chalcogenide such as copper indium gallium selenide, thin film silicon, organic absorber layers (Organic PhotoVoltaic, OPV, Dye Sensitized Solar Cell, DSSC), III-V compound semiconductor, CdTe, a layer comprising quantum dots, etc.), suitable semi-transparent electrodes and possibly auxiliary layers like a window layer to form a p-n heterojunction in the case of for example chalcogenides or the CdS/CdTe junction, and/or charge selective layers as often applied in OPV and metal-organic halide perovskite solar cells.

The selective charge transport layers may consist of a stack of different materials, with, for example, different doping levels or chemically different compounds. Ideally, these auxiliary layers are optically highly transparent and have suitable electronic properties for charge injection and charge transport. The electrodes and charge transport layers are typically located on either side of the absorber layer, however they can be located on one side of the absorber layer in the case of a back contacted cell (see for instance U. Bach 2016). Examples are known where a single charge selective layer is sufficient to realize a good working device (Graetzel Science Apr. 2014).

According to an aspect, the invention provides the tandem solar cell as described above wherein the stack of the thin dielectric layer and secondary layer, together form a selective carrier collecting contact to the bottom cell.

According to an aspect, the invention provides the tandem solar cell as described above wherein the secondary layer comprises poly-silicon. Typically, a film of poly-silicon with a thickness in the range from ~5 to ~500 nm has relatively high absorption in the visible range of the spectrum, but is transparent in the infrared range, which allows to use poly-silicon as a front layer for the bottom solar cell of the tandem solar cell. Thus, integration in a tandem solar cell structure is a solution to obtain the highest performance from silicon solar cells with a polysilicon passivating front contact or a polysilicon passivating front layer stack which otherwise (i.e., as stand-alone, single junction, use) would have very poor performance. Also, in stand-alone use of crystalline silicon cells with a polysilicon passivating contact, the polysilicon passivating contact is applied only to the back side, and additional process steps are required to provide e.g. a high quality diffused junction on the front side and lithography is required to provide contacts with very small contact area on the front side, to obtain high performance. According to an aspect of the invention, favorably polysilicon can be applied to both front and rear side of the silicon wafer, and for example the front and rear side polysilicon can be doped with opposite polarities, by e.g., printing a boron dopant source on one side and implanting phosphorus dopants on the other side, followed by a thermal anneal, resulting in a simple and low-cost cell process sequence for the bottom cell and yet a high performance of the tandem cell and module.

The poly-silicon is either intrinsic poly-silicon (meaning low or not intentionally doped, e.g. dopant concentration of $<10^{18}$ cm$^{-3}$), or the poly-silicon is doped with impurities of first or second conductivity type, the second conductivity type being opposite to the first conductivity type. In the case that the poly-silicon is doped to a sufficiently high level (typically $10^{19}$ cm$^{-3}$ or above), the passivating layer stack also forms a selective carrier collecting contact (passivating contact) to the bottom cell.

The polysilicon thickness can be in a range from ~5 to ~500 nm, where ~10-~200 nm is more optimal. For so-called fire-through contacting, ~100 nm or thicker is preferable in order to avoid damage to the thin dielectric from the contacting metal penetrating the polysilicon layer.

Alternatively, the secondary layer comprises a metal-oxide resulting in selective carrier collecting properties. Such a metal-oxide is selected from a group comprising molybdenum oxide, nickel oxide, tungsten oxide, vanadium oxide, Al-doped zinc oxide for a hole contact; or titanium oxide, tantalum oxide, indium tin oxide, for an electron contact. In this case, the passivating layer stack also forms a selective carrier collecting contact to the bottom cell. Alternatively, the secondary layer may comprise an n-type or p-type organic semiconductor material, such as PEDOT: PSS, PCBM, Spiro-OMeTAD, etc., resulting in selective carrier collecting properties.

According to an aspect, the invention provides a tandem solar cell as described above, wherein the front surface of the bottom solar cell is textured, and at least some of the sharp features of the texture are rounded or smoothened with an increased radius of curvature larger than about 25 nm upto about 1000 nm.

According to an aspect, the invention provides a tandem solar cell as described above, wherein the textured front surface comprises pyramidal shapes with intermediate valleys, the valleys being rounded with curvatures having radii selected from the range of ~25-~1000 nm.

According to an aspect, the invention provides a tandem solar cell as described above, wherein the top solar cell comprises a thin film photovoltaic layer structure comprising an upper carrier extraction layer, a lower carrier extraction layer and the photovoltaic absorber layer arranged between the upper and lower carrier extraction layers, and comprises at least a first contact layer arranged in contact with the upper extraction layer; the bottom solar cell comprises a silicon substrate of base conductivity type, with at least a first contact terminal at its rear surface.

According to an aspect, the invention provides a tandem solar cell as described above, wherein the top solar cell comprises a second contact layer in contact with the lower carrier extraction layer below the photovoltaic layer structure; the first contact layer having a first polarity and the second contact layer having a second polarity opposite to the first polarity; the bottom solar cell comprises a second contact terminal, the polarity of the second contact terminal being opposite to the polarity of the first contact terminal, and the second contact terminal being in contact with the secondary layer, and the second contact layer is in electrical connection with the second contact terminal.

Depending on the respective polarity of the second contact terminal and the secondary layer, either a two terminal (2T) or three terminal (3T) tandem solar cell can be constructed.

If an insulating layer or in general insulating space is arranged between the passivating layer stack and the second contact terminal of the bottom solar cell and the rear surface of the top solar cell, a four terminal (4T) tandem solar cell can be constructed.

According to an aspect, the invention provides a tandem solar cell as described above, wherein one of either the lower carrier extraction layer or second contact layer, and one of either the secondary layer or second contact terminal, coincide.

Optionally, the lower extraction layer in the top solar cell and the secondary layer in the bottom solar cell may coincide if the coinciding layer can extract carriers from the other cell's photovoltaic layer as well.

According to an aspect, the invention provides a tandem solar cell as described above, wherein the tandem solar cell comprises a third contact layer inbetween the bottom solar cell and the top solar cell, the third contact layer being in contact with the lower carrier extraction layer and in contact with the secondary layer on the crystalline silicon cell, wherein the polarity of the lower carrier extraction layer is opposite to the polarity of the secondary layer.

According to an aspect, the invention provides a tandem solar cell as described above, wherein one of either the lower carrier extraction layer or the lower contact layer is in direct contact with one of either the secondary layer or the second contact terminal.

According to an aspect, the invention provides a tandem solar cell as described above, wherein a recombination layer is arranged between the secondary layer which is a selective carrier extracting layer, and the lower carrier extraction layer at the rear surface of top solar cell, the recombination layer in electrical contact with the secondary layer and the lower carrier extraction layer, and the first contact layer of the top solar cell has a first polarity and the first contact terminal has a second polarity opposite to the first polarity.

In this manner a two terminal (2T) tandem solar cell can be constructed with the recombination layer providing efficient recombination of charge carriers from the lower extraction layer with charge carriers from the secondary layer. The recombination layer is optional if the interface between the lower extraction layer and the secondary layer provides for efficient recombination.

According to an aspect, the invention provides a tandem solar cell as described above, wherein the secondary layer which is a selective carrier extracting layer, is in electrical contact with the lower extraction layer at the rear surface of top solar cell, and the first contact layer of the top solar cell has a first polarity and the first contact terminal has a second polarity opposite to the first polarity.

According to an aspect, the invention provides a method for manufacturing a tandem solar cell comprising:

providing a bottom solar cell with a front surface and a rear surface;

providing a top solar cell with a front surface and rear surface;

arranging the top solar cell with its rear surface on the front surface of the bottom solar cell such that the front surfaces of both top and bottom solar cells are facing a radiation source during use;

wherein the top solar cell comprises a photovoltaic absorber layer with a bandgap greater than the bandgap of crystalline silicon, the bottom solar cell comprises a crystalline silicon substrate;

on the front surface of the bottom solar cell the crystalline silicon substrate comprises a passivating layer stack comprising a thin dielectric film and a secondary layer, the thin dielectric film being arranged between the silicon substrate and the secondary layer; the secondary layer being made either of a selective carrier extracting material or of polysilicon.

Advantageous embodiments are further defined by the dependent claims.

BRIEF DESCRIPTION OF DRAWINGS

The invention will be explained in more detail below with reference to drawings in which illustrative embodiments of the invention are shown.

FIG. 5 shows a schematic cross-section of a two terminal tandem solar cell according to an embodiment of the invention, and FIG. 6 shows a schematic cross-section of a two terminal tandem solar cell according to an embodiment of the invention.

DETAILED DESCRIPTION OF EMBODIMENTS

According to the present invention, the tandem solar cell comprises a stack of a top solar cell (or top photovoltaic device) and bottom solar cell (or bottom photovoltaic device), in which the top solar cell is arranged on top of the bottom solar cell. The top solar cell and the bottom solar cell are stacked in a manner that the rear surface of the top solar cell is stacked on the front surface of bottom solar cell.

The front surface refers to the surface of the respective solar cell that during use is substantially facing a radiation source (the sun). The rear surface refers to the surface of the respective solar cell that during use of the solar cell, is turned away from the radiation source.

The band gaps of the top solar cell photovoltaic material and the bottom solar cell photovoltaic material are configured in such a manner that the top solar cell is substantially transparent for radiation with wavelengths which are to be absorbed by the bottom solar cell. The top solar cell can e.g. be based on a metal-organic halide perovskite photovoltaic material absorber layer, a Cd—Te photovoltaic material absorber layer, or a CZTS (Copper Zinc Tin Sulfide) photovoltaic material absorber layer, which absorb radiation in the visible range of the spectrum (wavelength: ~400-~700 nm) and are relatively transparent for infrared radiation, and the bottom solar cell can be a crystalline silicon based solar cell which in this configuration utilizes radiation in mainly the infrared part of the spectrum (wavelength: ~700-~1100 nm).

Additional solar cells with even wider bandgaps can be included on top of this arrangement, or additional solar cells with even smaller bandgaps can be included below this arrangement, to create tandem cells with more than 2 absorber layers or junctions, as is known in the art.

Figure 1:
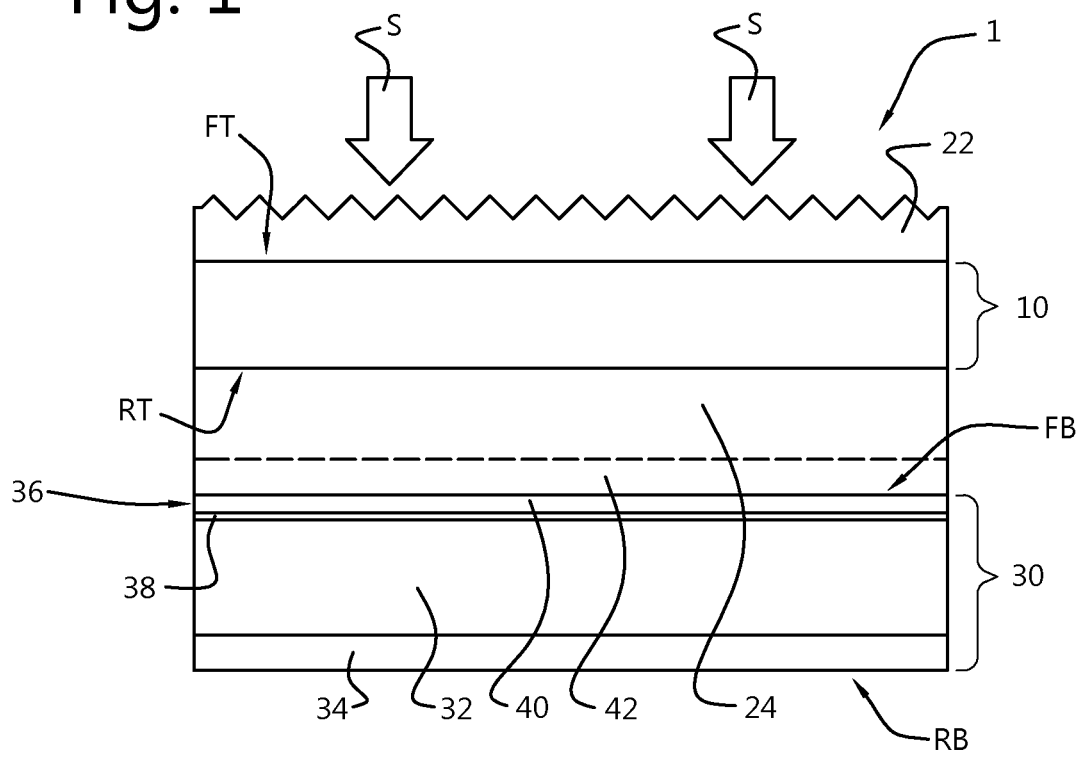
FIG. 1 shows a schematic cross-section of a four terminal tandem solar cell according to an embodiment of the invention.

FIG. 1 shows a cross-section of a tandem solar cell according to an embodiment of the present invention.

The tandem solar cell 1 comprises a top solar cell 10 and a bottom solar cell 30.

The top solar cell 10 is stacked on top of the bottom solar cell, with the rear surface RT of the top solar cell facing towards the front surface FB of the bottom solar cell.

The top solar cell 10 is a wide bandgap solar cell which is substantially transparent for light in the infrared. The bandgap of the top solar cell needs to be wider than that of crystalline silicon. About 1.35 eV-2.9 eV is allowable for a 4-terminal configuration, and about 1.35 eV to 1.9 eV for a 2-terminal configuration, to be theoretically able to reach a performance of 35% with a crystalline silicon bottom cell.

On top of the top solar cell 10 a first contact layer 18 is arranged (i.e., on the side of the front surface FT of the top solar cell). Further a second contact layer 20 is arranged on the top solar cell. (e.g., on the side of the rear surface RT of the top solar cell 10). The first and second contact layers 18, 20 have different polarities and form a first and second terminal of the tandem solar cell.

On the front surface FT of the top solar cell 10 a superstrate 22 is arranged. Such a superstrate may be a glass layer provided with a textured surface and/or an anti-reflection coating (not shown).

The bottom solar cell 30 is based on a crystalline silicon substrate 32 of base conductivity type, with at least a lower contact terminal 34 at its rear surface RB. Between the lower contact terminal and the substrate may be features as known in the art of creating a silicon solar cell, such as doped layers at the rear surface of the substrate, created e.g. by diffusion or deposition, an antireflection coating, etc.

On the front surface FB of the bottom solar cell 30 the crystalline silicon substrate 32 is provided with a passivating layer stack 36. This passivating layer stack comprises a thin dielectric film 38, e.g. a tunnel oxide film, and a secondary layer 40. The thin dielectric film 38 is arranged between the crystalline silicon substrate 32 and the secondary layer 40.

The bottom solar cell 30 may be a front-and-back contacted solar cell that is provided with an upper contact terminal of one polarity on the bottom solar cell's front surface FB, as indicated schematically by the dashed outline 42 and the lower contact terminal of opposite polarity on the rear surface RB. In this case the passivating layer stack is a passivating contact, selective extracting one type of carrier from the substrate. Layer 40 can e.g. be a doped polysilicon layer. Alternatively, the bottom solar cell 30 may be a back-contacted type solar cell with contact terminals of different polarities arranged on the bottom solar cell's rear surface RB. Such a back-contacted solar cell may be a metal-wrap-through, MWT, solar cell or an interdigitated back-contact, IBC, solar cell. If it is an IBC cell, secondary layer 40 may be an intrinsic or nearly intrinsic (not intentionally doped) polysilicon layer, by which the passivating layer stack provides excellent passivation, but which does not extract carriers from the substrate.

The contact terminals 34, 42 of the bottom solar cell form the third and fourth terminals of the tandem solar cell 1.

On the rear surface RT of the top solar cell 10 a spacer layer or layer stack 24 may be provided. The spacer layer 24 forms an intermediate layer between the rear surface RT of the top solar cell 10 and the front surface FB of the bottom solar cell 30.

The spacer layer 24 couples the top solar cell 10 to the bottom solar cell 30. The spacer layer 24 can be based on an encapsulant material. The spacer layer 24, encapsulant material, connects the top solar cell 10 with the bottom solar cell 30 mechanically and optically.

The secondary layer 40 can for example be a poly-silicon layer, either intrinsic, or doped to create a passivating contact, or can be a transparent conductive metal oxide to create a passivating contact as explained above.

According to the invention, the secondary layer 40 allows transmission of infrared radiation (or any radiation) that is not absorbed by the top solar cell 10 to the bottom solar cell 30, i.e., is transparent for radiation in the infrared range. As explained above, the combination of a thin dielectric such as a tunnel oxide 38 and a secondary layer of selective carrier extracting material 40 provides a comparatively low recombination rate of charge carriers which results in higher $V_{oc}$ and FF values for the bottom solar cell. Moreover, the transparency in the infrared range of the spectrum allows absorption of infrared radiation in the crystalline silicon bottom solar cell.

In an embodiment, the crystalline silicon substrate 32 is n-type, the secondary layer 40 is p-type doped poly-silicon.

Figure 2:
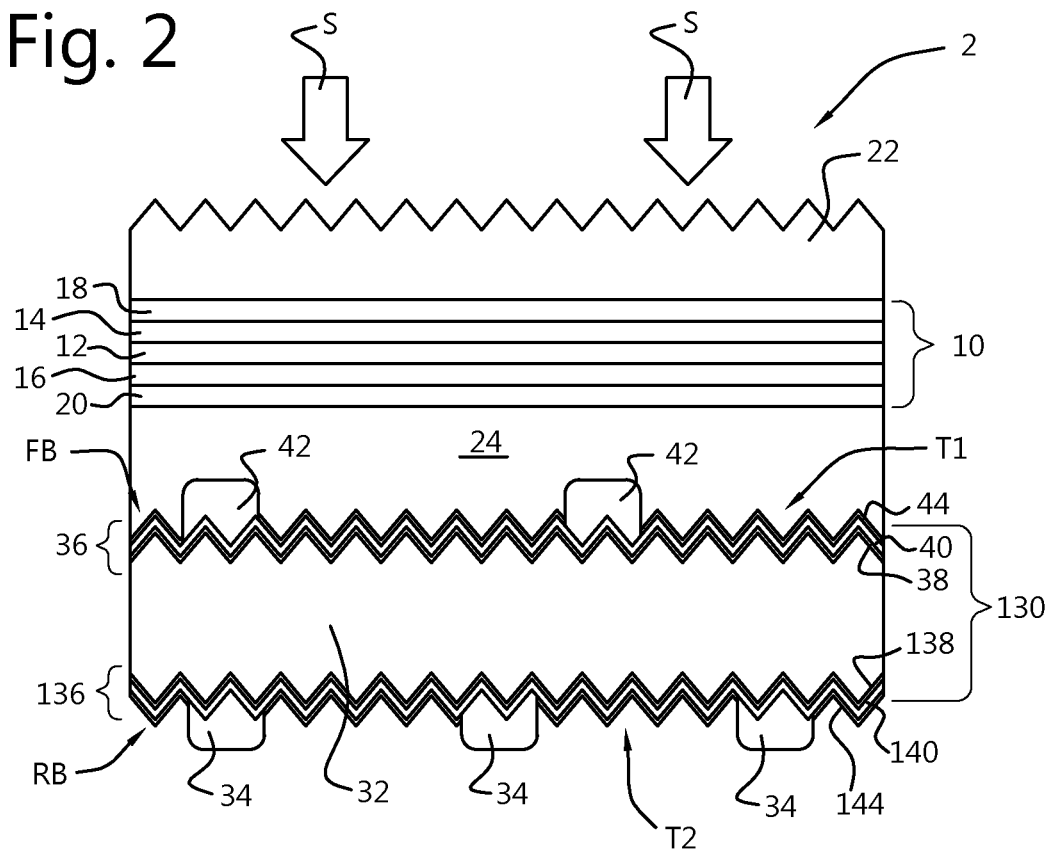
FIG. 2 shows a schematic cross-section of a four terminal tandem solar cell according to an embodiment of the invention.

FIG. 2 shows a schematic cross-section of a four terminal tandem solar cell according to a further embodiment of the invention.

In FIG. 2 entities with the same reference number as shown in FIG. 1 refer to corresponding or similar entities.

The embodiment of FIG. 2 shows a tandem solar cell 2 comprising a top solar cell 10 as described above and a bottom solar cell 130.

The top solar cell 10 is a wide bandgap solar cell, for example the top solar cell comprises a photovoltaic absorber layer 12 which is sandwiched between an upper carrier extraction layer 14 for carriers of a first polarity (e.g., electrons) and a lower carrier extraction layer 16 for carriers of a second polarity (e.g., holes) that is opposite to the first polarity.

In an embodiment, the photovoltaic absorber layer 12 is a layer of methylammonium-lead-triiodide perovskite, the upper carrier extraction layer 14 is a layer for extracting electrons, comprising TiO2 and the lower carrier extraction layer 16 for extracting holes is a layer of Spiro-OMeTAD ([2,2',7,7'-tetrakis(N,N-di-p-methoxyphenyl-amine)9,9'-spirobifluorene]).

Other electron and hole extracting layers are known in the art, as are variations of the perovskite composition (e.g. replacing some of the iodine by bromine) to change the bandgap or other properties. The top contact layer is a transparent conductive oxide layer (for example indium tin oxide). Similarly, the lower contact layer is transparent conductive oxide layer (for example indium tin oxide). Alternative contact layers for ITO, allowing higher transmission, such as hydrogenated indium oxide, are known in the art.

Other thin film solar cells are possible, such as e.g., semitransparent CdTe solar cell as known in the art, where the top contact layer is CTO/ZTO; the top carrier extracting layer is replaced by a CdS window layer which together with the CdTe forms a pn junction; the bottom carrier extracting layer can be omitted, and the bottom contact layer is for example ZnTe:Cu or selected from other suitable semitransparent back contact layers for CdTe. The structure of the top solar cell may be locally modified to accomplish monolithic interconnection, i.e. a series circuit of strips of the solar cell to increase the output voltage and reduce the resistive losses, as is known in the art.

The bottom solar cell 130 is similar to the silicon based bottom solar cell 30 of FIG. 1 and comprises both upper contact terminals 42 on the front surface FB and lower contact terminals 34 on the rear surface RB.

Further the front surface FB and the rear surface RB of the crystalline silicon substrate 32 are provided with a texture T1, T2.

In this embodiment, the textured front surface FB comprises the passivating layer stack 36 which is a selective carrier collecting layer stack (passivating contact), consisting of a thin dielectric 38 such as a tunnel oxide film and a secondary layer 40. The secondary layer 40 is covered by an antireflection (ARC) coating that also provides hydrogen to the tunnel oxide/silicon interface, such as hydrogen-rich silicon nitride (SiNx:H), deposited by plasma enhanced chemical vapor deposition (PECVD). Upper contact terminals 42 are connected to the secondary layer 40 through the ARC coating. Such a connection of the upper contact terminals 42 to the secondary layer 40 can be a so-called fire-through connection of a thick film metal paste as known in the art.

The textured rear surface RB of the bottom solar cell 130 comprises a second passivating layer stack 136 consisting of a second thin tunnel oxide film 138 and a rear surface secondary layer 140. The rear surface secondary layer 140 is covered by a second anti-reflection coating of SiNx:H with similar functions as the front side anti-reflection coating. Lower contact terminals 34 are connected to the rear surface secondary layer 140 through the second anti-reflection coating.

The secondary layer 40 on the front surface FB may be a doped poly-silicon layer of a first conductivity type, for example n-type. The secondary layer 140 on the rear surface RB has a second conductivity type opposite to the first conductivity type, such as a p-type doped poly-silicon layer. The doping level is at least $1\times10^{19}$ cm$^{-3}$, or preferably higher e.g. around $1-3\times10^{20}$ cm$^{-3}$. The thickness of the polysilicon is preferably between ~10 and ~300 nm. If fire-through contacts are used, the thickness is preferably at least ~100 nm to avoid damage from the metal fire-through contacts to the passivating thin oxide. It is favorable to position the p-type polysilicon layer at the rear side and the n-type polysilicon layer at the front side, because n-type polysilicon is more easily doped to high concentrations and has a higher carrier mobility. Since it is unexpectedly found that for a given polysilicon layer, the optical free carrier absorption (FCA) is larger when it is placed at the rear than at the front of a silicon solar cell, placing the higher doped n-type polysilicon at the front reduces FCA. Also because of the lower carrier mobility it is more favorable to position the p-type polysilicon at the rear, where a denser metallization grid is possible without shading losses.

The thickness of the polysilicon is not necessarily the same on front and back (if used on back) but if the polysilicon is uniformly deposited on both sides e.g. by low pressure chemical vapor deposition (LPCVD) it can be substantially the same which reduces process complexity. For example the front and rear side polysilicon can be doped, by e.g., printing a boron dopant source on one side and implanting phosphorus dopants on the other side, followed by a thermal anneal, resulting in a simple and low-cost cell process sequence for the bottom cell and yet a high performance of the tandem cell and module.

According to an embodiment, the texture on the front surface FB and/or the rear surface RB may have been rounded after texturing. This rounding or smoothening means that at least some sharp features of the texture, in particular the valleys between the texture pyramids in case of a pyramidal texture, get an increased radius of curvature, e.g. from only a few nm (about 25 nm) to about 100-about 200 nm, or even larger, such as upto 1000 nm.

The rounding can be done by an etching method as known in the art.

Figure 3:
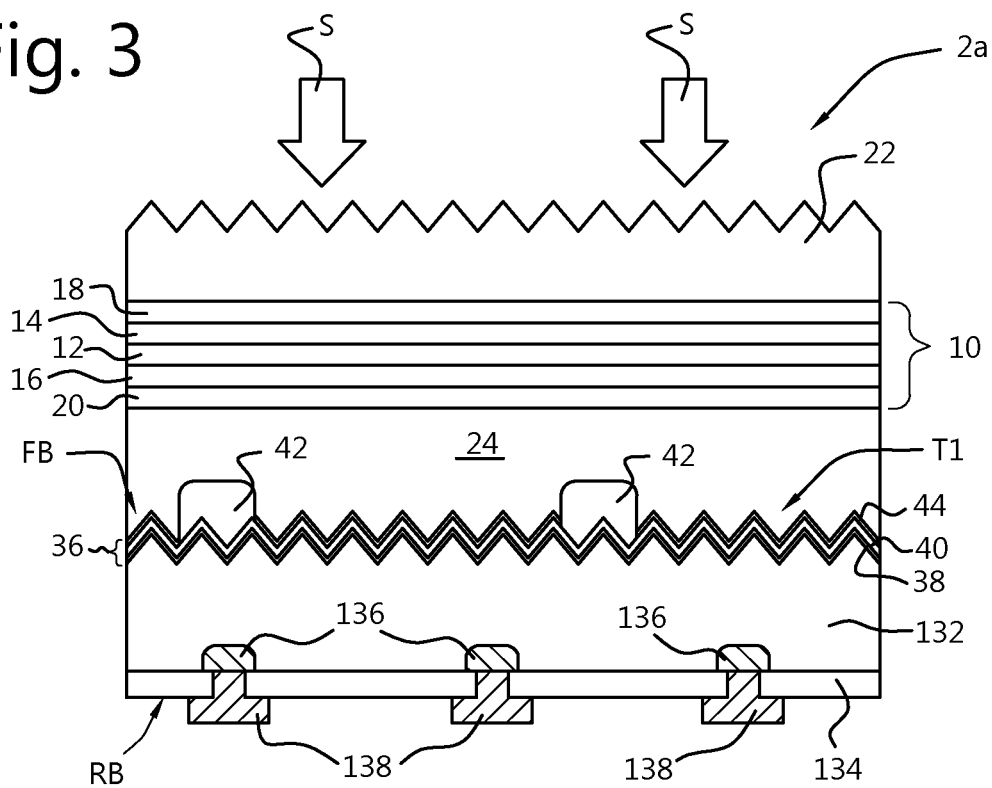
FIG. 3 shows a schematic cross-section of a four terminal tandem solar cell according to an embodiment of the invention.

FIG. 3 shows a schematic cross-section of a four terminal tandem solar cell according to an embodiment of the invention.

In the four terminal tandem solar cell of this embodiment 2a, the front of the bottom solar cell 132 is similar to the front of the silicon based bottom solar cell 130 of FIG. 2 and comprises upper contact terminals 42 on the front surface FB.

Furthermore, the front surface FB of the crystalline silicon substrate 132 is provided with a texture T1.

In this embodiment, the textured front surface FB comprises the passivating layer stack 36 which is a selective carrier collecting layer stack (passivating contact), 12 consisting of a thin dielectric 38 such as a tunnel oxide film and a secondary layer 40.

The secondary layer 40 is covered by an antireflection (ARC) coating that also provides hydrogen to the tunnel oxide region, such as hydrogen-rich silicon nitride (SiNx:H), deposited by plasma enhanced chemical vapor deposition (PECVD). Upper contact terminals 42 are connected to the secondary layer 40 through the ARC coating.

Such a connection of the upper contact terminals 42 to the secondary layer 40 can be a so-called fire-through connection of a thick film metal paste as known in the art.

The rear surface RB of the bottom solar cell is provided as the rear surface of a so-called PERC (passivated emitter and rear cell) or bifacial PERC cell. That means, the rear surface is provided as follows: The rear surface is smoothened or polished to a certain degree and comprises a second passivating layer stack consisting of a dielectric layer or layer stack 134 as used in PERC solar cells, e.g. a stack of aluminium oxide and silicon nitride, (the aluminium oxide between the substrate and the silicon nitride), or a stack of silicon oxide and silicon nitride, (the silicon oxide between the substrate and the silicon nitride). A metal layer 138 or layer stack is applied on top of the dielectric stack 134 (the dielectric stack being between the metal layer and the substrate), locally penetrating the dielectric layer stack, and forming a local back surface field of Al-doped silicon 136 where it is penetrating the dielectric layer stack. The metal layer can be provided over substantially the full rear surface or locally to result in a bifacial bottom cell. In FIG. 3 it is shown as provided locally.

For example, this embodiment can be produced as follows. After texturing, the thin oxide and a film of polysilicon can be applied to at least the front side. The polysilicon can then be doped if necessary, on at least the front side, for example by a diffusion in gaseous POCl$_3$ ambient at high temperature. It can also be doped, for example, by implantation and anneal. The polysilicon, if there is any deposited on the rear, can then be removed from the rear and the rear can be smoothened or polished by a single side etch. In further processing, coatings and metallization are provided as known in the state of the art for PERC solar cell processing.

Alternatively, in an alternative embodiment, the rear surface RB of the bottom solar cell 132 is provided with texture, or is polished, or is at a degree in-between. The rear surface comprises a second passivating layer stack consisting of a thin dielectric layer and a layer of polysilicon, that may be similar to the front side (e.g., similar in the sense of similar thicknesses or similar composition), but substantially undoped. A metal layer or layer stack is applied on top of the rear layer stack (the rear layer stack being between the metal layer and the substrate), locally penetrating the rear layer stack, and forming a local back surface field of Al-doped silicon where it is penetrating the rear layer stack. The metal layer can be provided over substantially the full rear surface or locally to result in a bifacial bottom cell.

For example, this embodiment can be produced as follows. After texturing and optionally rear polishing, the oxide and substantially intrinsic polysilicon are applied to front and rear surface. The polysilicon is then doped on the front side only, for example by implantation and anneal, or by printing a dopant paste on the front and anneal, or by other methods for local doping as known in the art. The rear may be provided with a diffusion barrier against the front side dopant if necessary. In further processing, coatings and metallization are provided. It is beneficial to apply a hydrogen-rich silicon nitride or other hydrogen-rich coating layer on the rear polysilicon to enhance its surface passivation. Metallization on the rear can be provided as known for PERC or bifacial PERC cells, e.g. first providing holes in the layer stack on the rear, subsequently providing a metal layer, and subsequently providing a high temperature such as in so-called firing.

According to an embodiment, the texture on the front surface FB may have been rounded after texturing. This rounding or smoothening means that at least some sharp features of the texture, in particular the valleys between the texture pyramids in case of a pyramidal texture, get an increased radius of curvature, e.g. from only a few nm (about 25 nm) to about 100-about 200 nm, or even larger, such as upto 1000 nm.

The rounding can be done by an etching method as known in the art.

Figure 4:
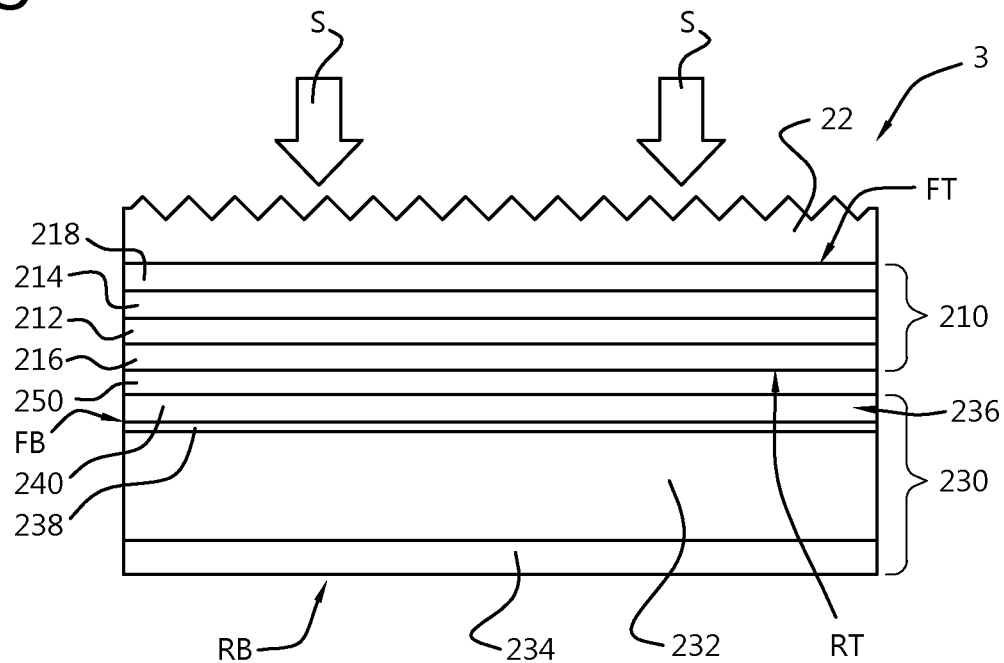
FIG. 4 shows a schematic cross-section of a two terminal tandem solar cell according to an embodiment of the invention.

FIG. 4 shows a schematic cross-section of a two terminal tandem solar cell according to an embodiment of the invention.

In FIG. 4 entities with the same reference number as shown in FIG. 1 or 2 or 3 refer to corresponding or similar entities.

The embodiment of FIG. 4 shows a tandem solar cell 3 comprising a top solar cell 210 stacked on a bottom solar cell 230.

The bottom solar cell 230 is based on a crystalline silicon substrate 232 of base conductivity type, with a lower contact terminal 234 at its rear surface RB.

On the front surface FB of the bottom solar cell 230 the silicon substrate 232 is provided with a passivating layer stack 236. This passivating layer stack comprises a thin dielectric (e.g., tunnel oxide) film 238 and a secondary layer 240. The thin dielectric film 238 is arranged between the silicon substrate 232 and the secondary layer 240.

The top solar cell 210 is a wide bandgap solar cell which substantially transmits light in the infrared. On top of the solar cell 210 a top contact layer 218 is arranged (i.e., on the side of the front surface FT of the top solar cell). On the rear surface RT of the top solar cell 210, a separation layer 250 is arranged between the rear surface layer of the top solar cell and the secondary layer 240 of the bottom solar cell 230.

The separation layer 250 comprises at least a recombination layer 252 to connect one polarity of the top solar cell 210 with the secondary layer 240 of the bottom solar cell (of opposite polarity).

The top contact layer 218 of the top solar cell 210 and the lower contact terminal 234 of the bottom solar cell form the first and second terminal of the tandem solar cell 3, respectively.

In an embodiment, the top solar cell 210 comprises a photovoltaic absorber layer 212 which is sandwiched between an upper carrier extraction layer 214 for carriers of a first polarity (e.g., electrons) and as rear surface layer, a lower carrier extraction layer 216 for carriers of a second polarity (e.g., holes) that is opposite to the first polarity. For example, the photovoltaic absorber layer 212 is a layer of metalorganic halide perovskite, such as methylammonium-lead-triiodide perovskite, the upper carrier extraction layer 214 is a layer for extracting electrons, comprising TiO2 and the lower carrier extraction layer 216 for extracting holes is a layer of Spiro-OMETAD. The top contact layer 218 is transparent conductive oxide layer (for example indium tin oxide) combined with a metal grid.

The silicon substrate 232 can be n-type, the secondary layer 240 at the interface with the top solar cell can be n-type doped poly-silicon to match the opposite polarity of the lower carrier extraction layer of the top solar cell, and the rear surface secondary layer of the top solar cell is in that case p-type doped poly-silicon (opposite to the polarity of the front surface).

FIG. 5 shows a schematic cross-section of a two terminal tandem solar cell according to an embodiment of the invention.

In FIG. 5 entities with the same reference number as shown in preceding FIGS. 1-4 refer to corresponding or similar entities.

The embodiment of FIG. 5 shows a tandem solar cell 4 comprising a top solar cell 210 as described above with reference to FIG. 3 and a bottom solar cell 330.

The bottom solar cell 330 is similar to the silicon based bottom solar cell 230 of FIG. 4 with the difference that the front surface FB and the rear surface RB of the silicon substrate 32 are provided with a texture T1, T2.

In this embodiment, the textured front surface FB comprises the passivating layer stack 336 consisting of a thin dielectric film 338 and a secondary layer 340 as described above with reference to FIGS. 1-4. The secondary layer 340 is covered by an anti-reflection coating. The bottom cell may comprise polysilicon passivating contacts on front and back side, as was described previously for FIG. 2.

In addition, the tandem solar cell comprises a separation layer 350 that is arranged between rear surface layer of the top solar cell (in an embodiment: the lower carrier extraction layer 216) and the secondary layer 340 of the passivating layer stack of the bottom solar cell 330 for providing an electrical connection. The separation layer 350 comprises a recombination layer that provides for efficient recombination of the carriers extracted by the secondary layer 340 and the carriers of opposite polarity extracted at the rear surface of the top solar cell (in an embodiment: by the carrier extraction layer 216)

The separation layer 350 or the lower carrier extracting layer 216 can be adapted as a smoothing layer to form a substantially flattened surface on which the lower contact layer of the top solar cell is arranged. This can be done for example by liquid deposition (printing, spraying, slot die coating, etc.) of the material of these layers filling preferably the valleys between texture features such as pyramids, and/or an etch-back process (e.g. plasma etch, mechanical etch) after deposition of these materials to flatten them. By providing a flattened surface the creation of a thin film solar cell comprising a stack of thin film layers is simplified. This flattening process is beneficial for tandem solar cells not only according to the invention but in general when the front side of the bottom solar cell should preferably be textured, and when the top solar cell process is not very well capable of conformally covering these bottom cell's texture features without degradation of the performance of the top cell.

It is noted that alternatively or additionally, the lower contact layer 216 of the top solar cell can be adapted as smoothing layer.

It is also noted that alternatively the separation layer 350 can be omitted, if sufficient recombination occurs at the interface between layer 340 and layer 216.

The texture features on front and/or back may be rounded before disposing the passivating layer stack, as described for FIG. 2.

FIG. 6 shows a schematic cross-section of a two terminal tandem solar cell 4a according to an embodiment of the invention.

In FIG. 6 entities with the same reference number as shown in preceding FIGS. 1-5 refer to corresponding or similar entities.

In the embodiment shown in FIG. 6, the bottom solar cell 132 is comparable to the solar cell 132 as shown and described with reference to FIG. 3. The rear surface RB of the bottom solar cell is provided as the rear surface of a PERC or bifacial PERC cell. The rear surface is smoothened or polished to a certain degree and comprises a second passivating layer stack consisting of a dielectric layer or layer stack 134 as used in so-called PERC solar cells, e.g. a stack of aluminium oxide and silicon nitride, (the aluminium oxide between the substrate and the silicon nitride), or a stack of silicon oxide and silicon nitride, (the silicon oxide between the substrate and the silicon nitride). A metal layer 138 or layer stack is applied on top of the dielectric stack 134 (the dielectric stack being between the metal layer and the substrate, locally penetrating the dielectric layer stack, and forming a local back surface field of Al-doped silicon 136 where it is penetrating the dielectric layer stack). The metal layer can be provided over substantially the full rear surface or locally to result in a bifacial bottom cell.

It is noted that a similar modification as shown in FIG. 6 can be made to the rear surface RB of the bottom solar cell 230 as shown in FIG. 4.

It is further noted that the present invention includes embodiments where on the front surface of the bottom solar cell a passivating layer stack is disposed which comprises a thin dielectric film and a secondary layer of either selective carrier extracting material or polysilicon, the thin dielectric film being arranged between the silicon substrate and the secondary layer, where the passivating layer stack is disposed in particular local patterns, or patterned in a particular local patterns with patterns of varying thickness or doping level or composition of the selective carrier extracting material.

Such a local pattern can be a grid pattern that aligns with, for example, a contact metallization grid (e.g., the metallization grid is represented by fingers 42 in FIGS. 2 and 3). For example, if the passivating layer stack comprises a thin oxide and a film of doped polysilicon, the polysilicon can be thinned or completely removed in the areas of the front surface FB between the fingers of the grid. Advantageously, such embodiments of the invention can be used to provide a larger thickness of the selective carrier extracting material (for example, doped polysilicon with thickness 100 nm or larger) between the metal grid fingers and the wafer substrate, which may result in a reduction of the recombination induced by the metal grid fingers, and to provide a smaller thickness on the wafer surface areas on FB in-between the grid fingers, which may result in a reduction of so-called free carrier absorption of IR wavelength photons. Thus the performance of the bottom solar cell can be improved. Such variation of the thickness can be accomplished, e.g., by local chemical etch-back processes for the polysilicon as known in the art. Advantageously, the selective carrier extracting material as used between the metal grid fingers and the wafer substrate extends for some length laterally from the metal grid fingers, to provide alignment tolerance in the process of applying the metal grid fingers. For example, the fingers of selective carrier extracting material below the metal grid fingers can be 100-500 micrometer wider than the metal grid fingers. Also advantageously, a doping layer for the same carrier type as the selective carrier extracting material can be provided in the front surface of the wafer substrate of the bottom cell, for example in the surface between as well as below the grid fingers, which can reduce the series resistance of the bottom cell.

A tandem solar cell in accordance with an embodiment of the present invention can be manufactured from a bottom solar cell based on a silicon substrate and a top solar cell based on a thin film photovoltaic device.

A method for manufacturing such tandem solar cell comprises:
providing a bottom solar cell with a front surface and a rear surface;
providing a top solar cell with a front surface and rear surface;
arranging the top solar cell with its rear surface on the front surface of the bottom solar cell such that the front surfaces of both top and bottom solar cells are facing a radiation source during use;
wherein the top solar cell comprises a photovoltaic absorber with a bandgap greater than that of crystalline silicon;

the bottom solar cell comprises a crystalline silicon substrate;
on the front surface of the bottom solar cell the silicon substrate comprises a passivating layer stack comprising a thin dielectric film and a secondary layer of a selective carrier collecting material or polysilicon, the thin dielectric film being arranged between the silicon substrate and the secondary layer.

In the foregoing description of the figures, the invention has been described with reference to specific embodiments thereof. It will, however, be evident that various modifications and changes may be made thereto without departing from the scope of the invention as summarized in the attached claims.

In addition, modifications may be made to adapt a particular situation or material to the teachings of the invention without departing from the essential scope thereof. Therefore, it is intended that the invention not be limited to the particular embodiments disclosed, but that the invention includes all embodiments falling within the scope of the appended claims.

In particular, combinations of specific features of various aspects of the invention may be made. An aspect of the invention may be further advantageously enhanced by adding a feature that was described in relation to another aspect of the invention.

It is to be understood that the invention is limited by the annexed claims and its technical equivalents only. In this document and in its claims, the verb "to comprise" and its conjugations are used in their non-limiting sense to mean that items following the word are included, without excluding items not specifically mentioned. In addition, reference to an element by the indefinite article "a" or "an" does not exclude the possibility that more than one of the element is present, unless the context clearly requires that there be one and only one of the elements. The indefinite article "a" or "an" thus usually means "at least one".

The invention claimed is:
1. A tandem solar cell comprising
a top solar cell and a bottom solar cell;
the top solar cell and the bottom solar cell each having a respective front surface and a rear surface; the respective front surfaces being adapted for facing a radiation source during use; the top solar cell being arranged with its rear surface overlying to the front surface of the bottom solar cell;
the top solar cell comprising a photovoltaic absorber layer with a bandgap greater than that of crystalline silicon;
the bottom solar cell comprising a crystalline silicon substrate;
on the front surface of the bottom solar cell a passivating layer stack is arranged which passivating layer stack consists of a thin dielectric film and a secondary layer of polysilicon, the thin dielectric film interfacing with the silicon substrate and arranged between the front surface of the silicon substrate and the secondary layer.

2. The tandem solar cell according to claim 1, wherein the secondary layer comprises intrinsic poly-silicon.

3. The tandem solar cell according to claim 1, wherein the secondary layer comprises poly-silicon doped with impurities of either first or second conductivity type.

4. The tandem solar cell according to claim 1, wherein the secondary layer is substantially transparent for infrared radiation.

5. The tandem solar cell according to claim 1, wherein the thin dielectric film has a thickness between 0.5 and 5 nm.

6. The tandem solar cell according to claim 1, wherein the thin dielectric film is a layer of either silicon oxide or silicon oxynitride with a thickness between 1 and 2.5 nm.

7. The tandem solar cell according to claim 1, wherein the poly-silicon has a thickness in a range from about 5 to about 500 nm.

8. The tandem solar cell according to claim 6, wherein the doping level of the polysilicon layer is higher than about $1 \times 10^{19}$ cm$^{-3}$.

9. The tandem solar cell according to claim 1, wherein the top solar cell comprises a metal-organic halide perovskite layer as photovoltaic absorber layer.

10. The tandem solar cell according to claim 1, wherein the top solar cell comprises a CdTe layer as photovoltaic absorber layer.

11. The tandem solar cell according to claim 1, wherein the front surface of the bottom solar cell is textured, and at least some sharp features of the texture are rounded (smoothened) with an increased radius of curvature larger than about 25 nm up to about 1000 nm.

12. The tandem solar cell according to claim 11, wherein the textured front surface comprises pyramidal shapes with intermediate valleys, the valleys being rounded with curvatures having radii selected from the range of ~25-~1000 nm.

13. The tandem solar cell according to claim 1, wherein the top solar cell comprises a thin film photovoltaic layer structure comprising an upper carrier extraction layer, a lower carrier extraction layer and the photovoltaic absorber layer arranged between the upper and lower carrier extraction layers, and comprises at least a first contact layer arranged in contact with the upper extraction layer;
the bottom solar cell comprises a silicon substrate of base conductivity type, with at least a first contact terminal at its rear surface.

14. The tandem solar cell according to claim 13, wherein the top solar cell comprises a second contact layer in contact with the lower carrier extraction layer below the photovoltaic layer structure; the first contact layer having a first polarity and the second contact layer having a second polarity opposite to the first polarity;
the bottom solar cell comprises a second contact terminal, the polarity of the second contact terminal being opposite to the polarity of the first contact terminal, and
the second contact terminal being in contact with the secondary layer, and the second contact layer is in electrical connection with the second contact terminal.

15. The tandem solar cell according to claim 14, wherein one of either the lower carrier extraction layer or second contact layer corresponds to one of either the secondary layer or second contact terminal.

16. The tandem solar cell according to claim 15, wherein the tandem solar cell comprises a third contact layer in between the bottom solar cell and the top solar cell, the third contact layer being in contact with the lower carrier extraction layer and in contact with the secondary layer on the crystalline silicon cell, wherein the polarity of the lower carrier extraction layer is opposite to the polarity of the secondary layer.

17. The tandem solar cell according to claim 15, wherein one of either the lower carrier extraction layer or the lower contact layer is in direct contact with one of either the secondary layer or the second contact terminal.

18. The tandem solar cell according to claim 15, wherein a recombination layer is arranged between the secondary layer, and the lower carrier extraction layer at the rear surface of top solar cell, the recombination layer in electrical contact with the secondary layer and the lower carrier extraction layer, and
the first contact layer of the top solar cell has a first polarity and the first contact terminal has a second polarity opposite to the first polarity.

19. The tandem solar cell according to claim 13, wherein the secondary layer, is in electrical contact with the lower extraction layer at the rear surface of top solar cell, and
the first contact layer of the top solar cell has a first polarity and the first contact terminal has a second polarity opposite to the first polarity.

20. The tandem solar cell according to claim 1, wherein the thin dielectric layer is either a silicon dioxide layer or a silicon oxynitride layer.

21. A solar panel comprising at least one tandem solar cell as defined in claim 1.

22. The tandem solar cell according to claim 1, wherein the poly-silicon has a thickness in a range between about 10 nm and about 200 nm.

23. The tandem solar cell according to claim 1, wherein the passivating layer stack is provided on and in contact with the crystalline silicon substrate.

* * * * *